US012534822B2

(12) United States Patent
Liu et al.

(10) Patent No.: US 12,534,822 B2
(45) Date of Patent: Jan. 27, 2026

(54) BEARING SYSTEMS AND POWER CONTROL METHODS FOR BEARING DEVICE

(71) Applicant: ENKRIS SEMICONDUCTOR, INC., Jiangsu (CN)

(72) Inventors: Kai Liu, Jiangsu (CN); Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 702 days.

(21) Appl. No.: 18/008,904

(22) PCT Filed: Oct. 21, 2020

(86) PCT No.: PCT/CN2020/122480

§ 371 (c)(1),
(2) Date: Dec. 7, 2022

(87) PCT Pub. No.: WO2022/082506

PCT Pub. Date: Apr. 28, 2022

(65) Prior Publication Data

US 2023/0212780 A1 Jul. 6, 2023

(51) Int. Cl.
*C23C 16/458* (2006.01)
*C23C 16/46* (2006.01)
(Continued)

(52) U.S. Cl.
CPC .......... *C30B 25/10* (2013.01); *C23C 16/4584* (2013.01); *C23C 16/46* (2013.01);
(Continued)

(58) Field of Classification Search
CPC ......... C30B 25/10; C30B 25/12; C30B 25/16; C23C 16/4584; C23C 16/46; C23C 16/52;
(Continued)

(56) References Cited

U.S. PATENT DOCUMENTS 5,294,778 A 3/1994 Carman et al.
2010/0055351 A1* 3/2010 Kato ................ C23C 16/45521 118/712

(Continued)

FOREIGN PATENT DOCUMENTS

| | | | |
|---|---|---|---|
| CN | 102362332 | A | 2/2012 |
| CN | 107845589 | A | 3/2018 |
| CN | 108728828 | A | 11/2018 |

OTHER PUBLICATIONS

ISA State Intellectual Property Office of the People's Republic of China, International Search Report Issued in Application No. PCT/CN2020/122480, Jul. 20, 2021, WIPO, 4 pages.

(Continued)

*Primary Examiner* — Tiffany T Tran
(74) *Attorney, Agent, or Firm* — BSJ & SUN LLC

(57) ABSTRACT

Provided are a bearing system and a power control method for a bearing device. The bearing system comprises a susceptor; a rotating shaft fixed under the susceptor, where the rotating shaft and the susceptor rotate synchronously; a heating wire located under the susceptor, where the heating wire comprises n heating wire units arranged in a circumferential direction of the susceptor, n≥2, and temperature of each of the heating wire units is independently controlled; and a power controller configured to: during rotation of the susceptor, control at least one of: a power of a heating wire unit directly under a down end of the susceptor to be less than a power of each of other heating wire units, or a power of a heating wire unit directly under an up end of the susceptor to be greater than a power of each of other heating wire units.

13 Claims, 8 Drawing Sheets

(51) Int. Cl.
*C23C 16/52* (2006.01)
*C30B 25/10* (2006.01)
*C30B 25/12* (2006.01)
*C30B 25/16* (2006.01)
*H05B 1/02* (2006.01)

(52) U.S. Cl.
CPC .............. *C23C 16/52* (2013.01); *C30B 25/12* (2013.01); *C30B 25/16* (2013.01); *H05B 1/0247* (2013.01)

(58) Field of Classification Search
CPC .. C23C 16/4586; H05B 1/0247; H05B 6/105; H05B 6/06
See application file for complete search history.

(56) References Cited

U.S. PATENT DOCUMENTS

2012/0031889 A1* 2/2012 Komatsu ........... H01L 21/67103 219/201
2014/0251214 A1 9/2014 Cuvalci et al.

OTHER PUBLICATIONS

ISA State Intellectual Property Office of the People's Republic of China, Written Opinion of the International Searching Authority Issued in Application No. PCT/CN2020/122480, Jul. 20, 2021, WIPO, 6 pages. (Submitted with Machine/Partial Translation).

* cited by examiner

BEARING SYSTEMS AND POWER CONTROL METHODS FOR BEARING DEVICE

CROSS REFERENCE TO RELATED APPLICATIONS

This application is a US National Phase of a PCT Application No. PCT/CN2020/122480 filed on Oct. 21, 2020, the entire contents of which are incorporated herein by reference in their entireties.

TECHNICAL FIELD

The present disclosure relates to the technical field of semiconductor, and in particular, to bearing systems and power control methods for a bearing device.

BACKGROUND

Some semiconductor materials, such as GaN-based materials, are formed by epitaxial growth on substrates through deposition processes. In a deposition process, a substrate is placed on a susceptor of a bearing system, and a heating wire heats up to make the substrate satisfy the deposition process conditions. During deposition, the susceptor rotates to equalize the temperature of each region of the substrate, such that the property of each region of the epitaxially grown film layer is consistent.

However, in an actual process, it is found that the property of each region of the epitaxially grown film layer on the substrate is difficult to be consistent.

SUMMARY

According to the analysis by inventors, the reason why the performance of the epitaxially grown film layer on the substrate is difficult to be consistent is that the susceptor is assembled inclined to the rotating shaft, that is, the susceptor has a down end and an up end. In this way, in the deposition process, when the susceptor rotates integrally with the rotating shaft, since the heating wire is a whole piece and the temperature is roughly the same, the region of the substrate at the down end is closer to the heating wire and the temperature is higher, and the region of the substrate at the up end is far away from the heating wire and the temperature is lower, resulting in different growth temperatures in each region of the substrate, thus causing different properties of the film layer.

Based on the analysis, the present disclosure provides bearing systems and power control methods for bearing devices, with the purpose of improving the property uniformity of each region of the epitaxially grown film layer on the substrate.

In order to achieve the purpose, one aspect of the present disclosure provides a bearing system, including:

- a susceptor;
- a rotating shaft fixed under the susceptor, where the rotating shaft and the susceptor rotate synchronously;
- a heating wire located under the susceptor, where the heating wire includes n heating wire units arranged in a circumferential direction of the susceptor, $n \geq 2$, and temperature of each of the heating wire units is independently controlled; and
- a power controller configured to: during rotation of the susceptor, control at least one of: a power of a heating wire unit directly under a down end of the susceptor to be less than a power of each of other heating wire units, or a power of a heating wire unit directly under an up end of the susceptor to be greater than a power of each of other heating wire units.

In some embodiments, each of the heating wire units spreads out at a same angle in the circumferential direction of the susceptor.

In some embodiments, the bearing system further includes:

- a parameter acquisitor configured to acquire a rotation speed and a rotation direction of the susceptor, and number information of an initial heating wire unit directly under the down end of the susceptor at an initial position;
- where the power controller is further configured to, according to the rotation speed, the rotation direction, and the number information of the initial heating wire unit acquired by the parameter acquisitor, upon the n heating wire units arranged in the rotation direction of the susceptor each rotates for an interval of 1/(n*rotation speed), control a power of the corresponding heating wire unit from a first power to a second power, where the first power is less than the second power.

In some embodiments, the parameter acquisitor is further configured to acquire a first distance between the down end and the initial heating wire unit, and a second distance between a fixing point of the susceptor and the rotating shaft and the heating wire directly under the fixing point, where a ratio between the first power and the second power is proportional to a ratio between the first distance and the second distance.

In some embodiments, the bearing system further includes:

- a parameter acquisitor configured to acquire a rotation speed and a rotation direction of the susceptor, and number information of an initial heating wire unit directly under the up end of the susceptor at an initial position;
- where the power controller is further configured to, according to the rotation speed, the rotation direction, and the number information of the initial heating wire unit acquired by the parameter acquisitor, upon the n heating wire units arranged in the rotation direction of the susceptor each rotates for an interval of 1/(n*rotation speed), control a power of the corresponding heating wire unit from a third power to a second power, where the third power is greater than the second power.

In some embodiments, the parameter acquisitor is further configured to acquire a third distance between the up end and the initial heating wire unit, and a second distance between a fixing point of the susceptor and the rotating shaft and the heating wire directly under the fixing point, where a ratio between the third power and the second power is proportional to a ratio between the third distance and the second distance.

In some embodiments, the bearing system further includes:

- a detector configured to acquire number information of the heating wire unit directly under the down end of the susceptor in real time;
- where the power controller is further configured to configure the power of the heating wire unit detected by the detector as a first power and the power of the other heating wire units as a second power, where the first power is less than the second power.

In some embodiments, the bearing system further includes:

a detector configured to acquire number information of the heating wire unit directly under the up end of the susceptor in real time;

where the power controller is further configured to configure the power of the heating wire unit detected by the detector as a third power and the power of the other heating wire units as a second power, where the third power is greater than the second power.

Another aspect of the present disclosure provides a power control method for a bearing device, where the bearing device includes:

a susceptor;

a rotating shaft fixed under the susceptor, where the rotating shaft and the susceptor rotate synchronously; and a heating wire located under the susceptor, where the heating wire includes n heating wire units arranged in a circumferential direction of the susceptor, n≥2, and temperature of each of the heating wire units is independently controlled; and the power control method includes: during rotation of the susceptor, at least one of: configuring a power of a heating wire unit directly under a down end of the susceptor to be less than a power of each of other heating wire units, or configuring a power of a heating wire unit directly under an up end of the susceptor to be greater than a power of each of other heating wire units.

In some embodiments, each of the heating wire units spreads out at a same angle in the circumferential direction of the susceptor; and during the rotation, configuring the power of the heating wire unit directly under the down end of the susceptor to be less than the power of each of the other heating wire units includes:

acquiring a rotation speed and a rotation direction of the susceptor, and number information of an initial heating wire unit directly under the down end of the susceptor at an initial position; and according to the rotation speed, the rotation direction, and the number information of the initial heating wire unit, upon the n heating wire units arranged in the rotation direction of the susceptor each rotates for an interval of 1/(n*rotation speed), controlling a power of the corresponding heating wire unit from a first power to a second power, where the first power is less than the second power.

In some embodiments, each of the heating wire units spreads out at a same angle in the circumferential direction of the susceptor; and during the rotation, configuring the power of the heating wire unit directly under the up end of the susceptor to be greater than the power of each of the other heating wire units includes:

acquiring a rotation speed and a rotation direction of the susceptor, and number information of an initial heating wire unit directly under the up end of the susceptor at an initial position; and according to the rotation speed, the rotation direction, and the number information of the initial heating wire unit, upon the n heating wire units arranged in the rotation direction of the susceptor each rotates for an interval of 1/(n*rotation speed), control a power of the corresponding heating wire unit from a third power to a second power, where the third power is greater than the second power.

In some embodiments, during the rotation, configuring the power of the heating wire unit directly under the down end of the susceptor to be less than the power of each of the other heating wire units includes:

acquiring number information of the heating wire unit directly under the down end of the susceptor in real time; and configuring the power of the detected heating wire unit as a first power and the power of the other heating wire units as a second power, where the first power is less than the second power.

In some embodiments, during the rotation, configuring the power of the heating wire unit directly under the up end of the susceptor to be greater than the power of each of the other heating wire units includes:

acquiring number information of the heating wire unit directly under the up end of the susceptor in real time; and configuring the power of the detected heating wire unit as a third power and the power of the other heating wire units as a second power, where the third power is greater than the second power.

Figure 1:
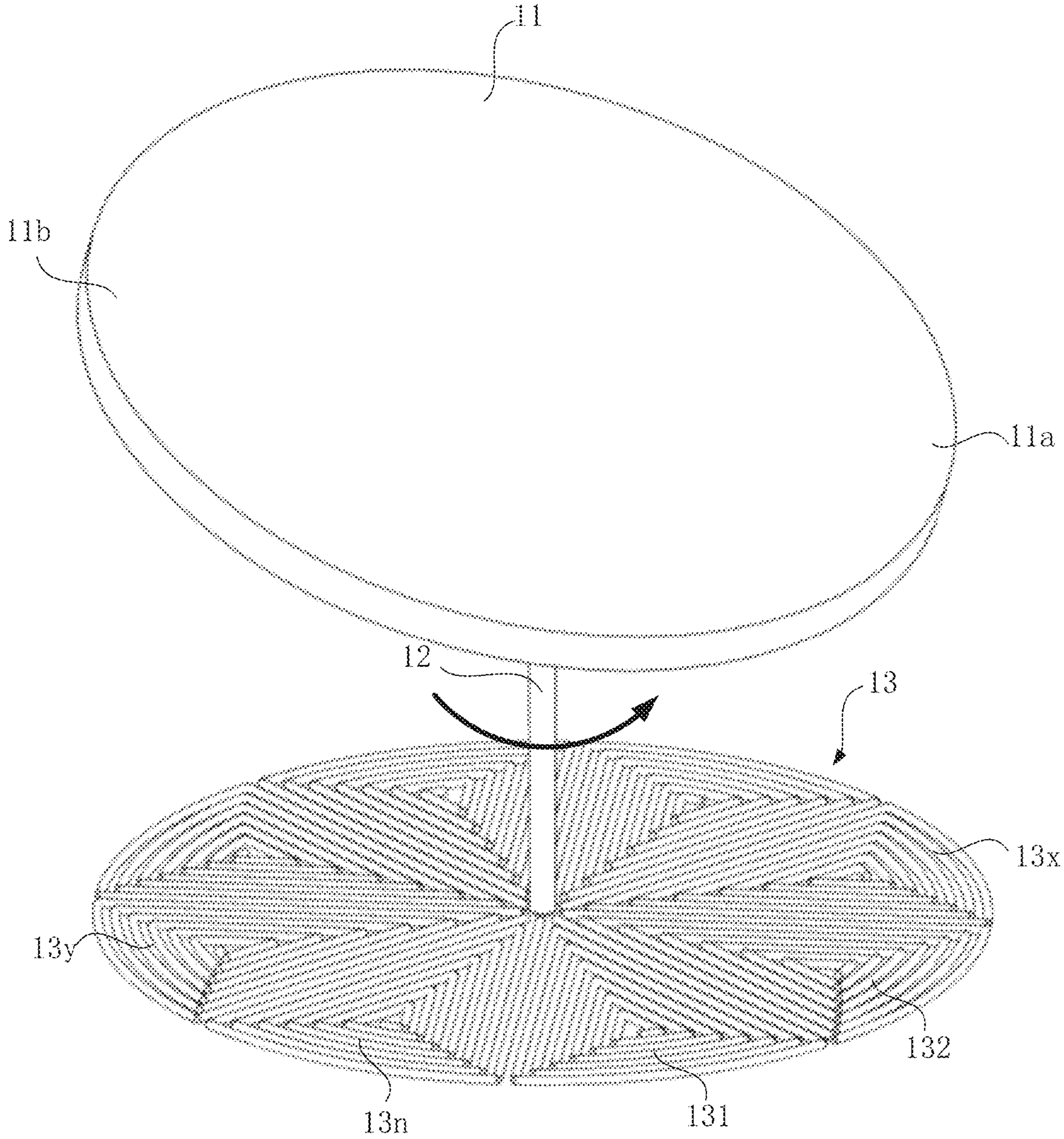
FIG. 1 is a schematic perspective structure diagram of a bearing device according to a first embodiment of the present disclosure.

To facilitate understanding of the present disclosure, all reference numerals appearing in the present disclosure are listed below:

| | |
|---|---|
| susceptor 11 | rotating shaft 12 |
| heating wire 13 | heating wire unites 131, 132 . . . , 13n, 13x, 13y, 13p, 13q |
| down end 11a | up end 11b |
| power controller 14 | parameter acquisitor 15 |
| detector 16 | bearing systems 1, 2, 3, 4, 5 |
| a first distance L1 | a second distance L2 |
| a third distance L3 | a fourth distance L4 |
| a fifth distance L5 | |

DETAILED DESCRIPTION OF THE EMBODIMENTS

Embodiments of the present disclosure will be described in detail below with reference to the accompanying drawings.

Figure 2:
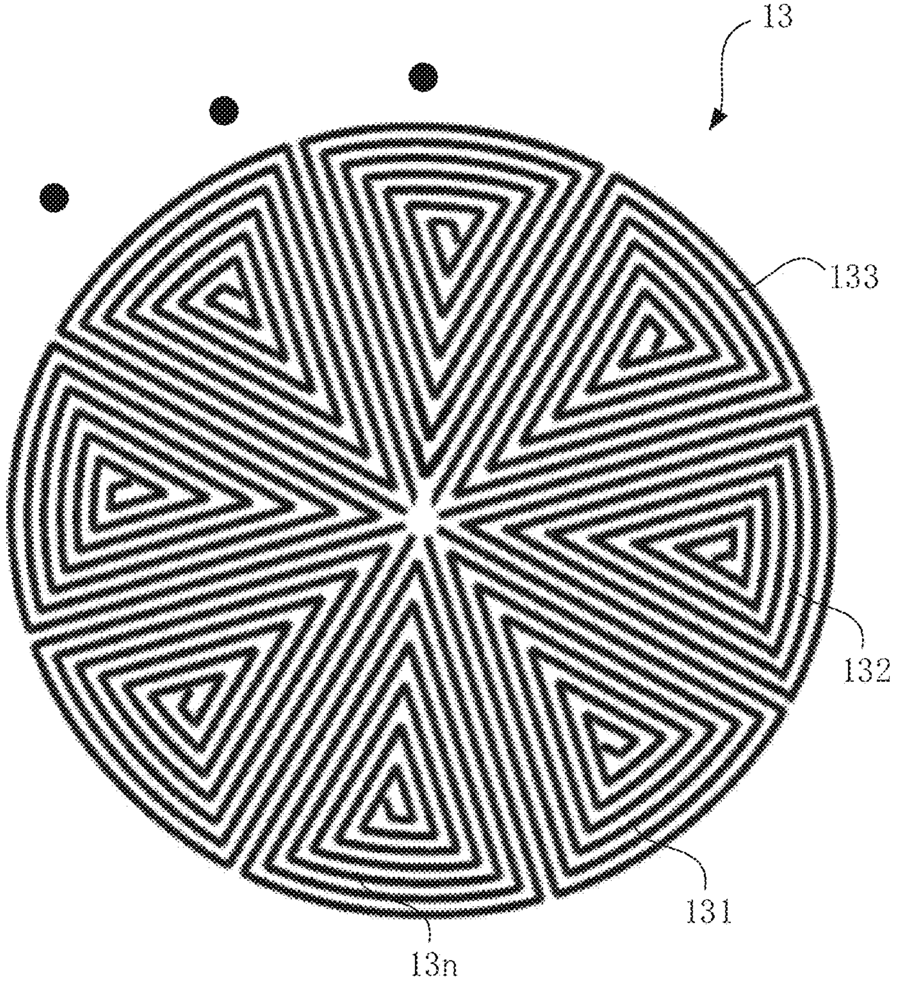
FIG. 2 is a top view of a heating wire in FIG. 1.
Figure 3:
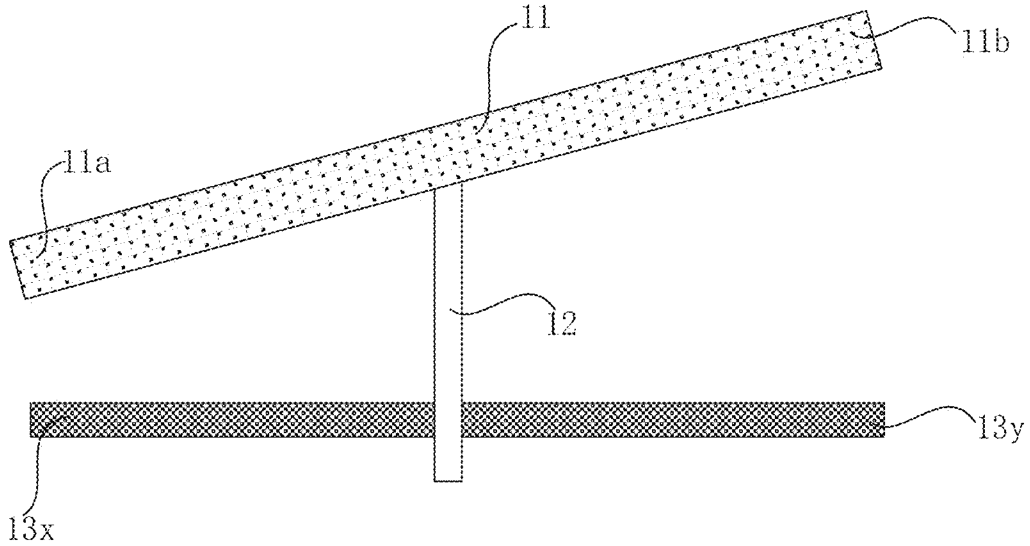
FIG. 3 is a schematic cross-sectional structure diagram of a vertical section of the bearing device in FIG. 1.

FIG. 1 is a schematic perspective structure diagram of a bearing device according to a first embodiment of the present disclosure. FIG. 2 is a top view of a heating wire in FIG. 1. FIG. 3 is a schematic cross-sectional structure diagram of a vertical section of the bearing device in FIG. 1.

Referring to FIGS. 1 to 3, the bearing device includes:

a susceptor 11;

a rotating shaft 12 fixed under the susceptor 11, where the rotating shaft 12 and the susceptor 11 rotate synchronously; and a heating wire 13 located under the susceptor 11, where the heating wire 13 includes n heating wire units 131, 132, . . . , 13*n*, *n*≥2, and temperature of each of the heating wire units 131, 132 . . . , 13*n* is independently controlled.

The power control method for the bearing device includes: during rotation of the susceptor 11, a power of a heating wire unit 13*x* directly under a down end 11*a* of the susceptor 11 is configured to be less than a power of each of other heating wire units 131, 132, . . . , 13*x*−1, 13*x*+1, . . . , 13*n*, and/or a power of a heating wire unit 13*y* directly under an up end 11*b* of the susceptor 11 is configured to be greater than a power of each of other heating wire units 131, 132, . . . , 13*y*−1, 13*y*+1, . . . , 13*n*.

A material of the susceptor 11 may include graphite. Referring to FIG. 1, when the susceptor 11 is installed on the rotating shaft 12, the problem of installation inclination often occurs, that is, the susceptor 11 is not perpendicular to the rotating shaft 12, and is most commonly inclined at a small angle.

A material of the heating wire 13 may include copper or aluminum. The heating wire 13 may be embedded in an insulating material such as asbestos tiles. Referring to FIG. 2, in this embodiment, each of the heating wire units 131, 132, . . . , 13*n* spreads out at a same angle in the circumferential direction of the susceptor 11. In other embodiments, each of the heating wire units 131, 132, . . . , 13*n* may spread out at a different angle in the circumferential direction of the susceptor 11.

Compared with embodiments in related art where a heating wire is a single piece and has a same power, in the embodiments of the present disclosure, the heating wire 13 is divided into n heating wire units 131, 132, . . . , 13*n*, and temperature of each of the heating wire units 131, 132, . . . , 13*n* are independently controlled, and then heating wire units 131, 132, . . . , 13*n* are arranged in a circumferential direction of the susceptor 11. During rotation of the susceptor 11, by controlling a power of a heating wire unit 13*x* directly under a down end 11*a* of the susceptor 11 to be less than powers of other heating wire units 131, 132, . . . , 13*x*−1, 13*x*+1, . . . , 13*n*, and/or controlling a power of a heating wire unit 13*y* directly under the up end 11*b* of the susceptor 11 to be greater than powers of other heating wire units 131, 132, . . . , 13*y*−1, 13*y*+1, . . . , 13*n*, temperature of each region of the susceptor 11 is consistent, and a growth temperature of each region of a substrate on the susceptor 11 is uniform, thereby realizing an epitaxially grown film layer with uniform properties.

Figure 4:
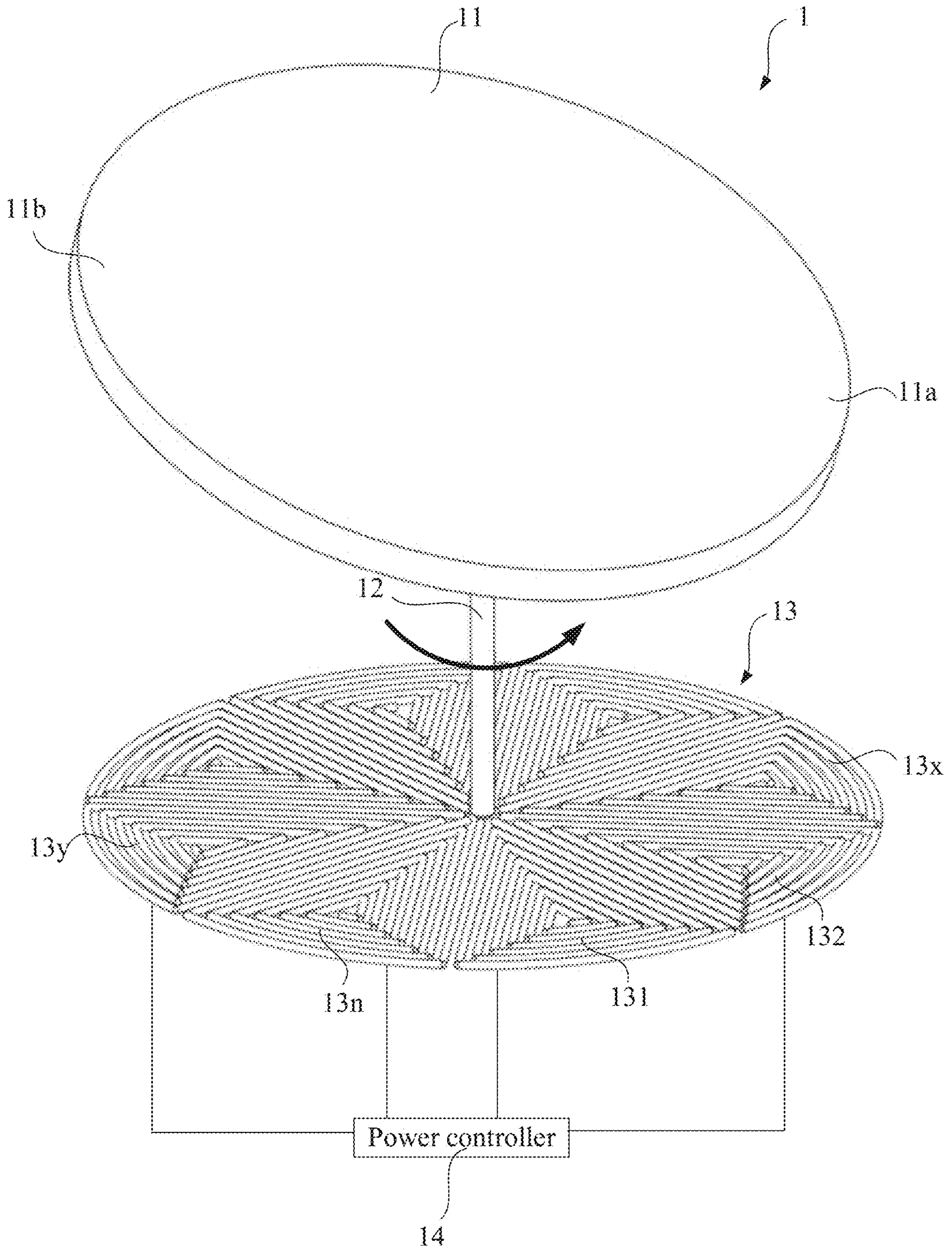
FIG. 4 is a schematic perspective structure diagram of a bearing system according to the first embodiment of the present disclosure.
Figure 5:
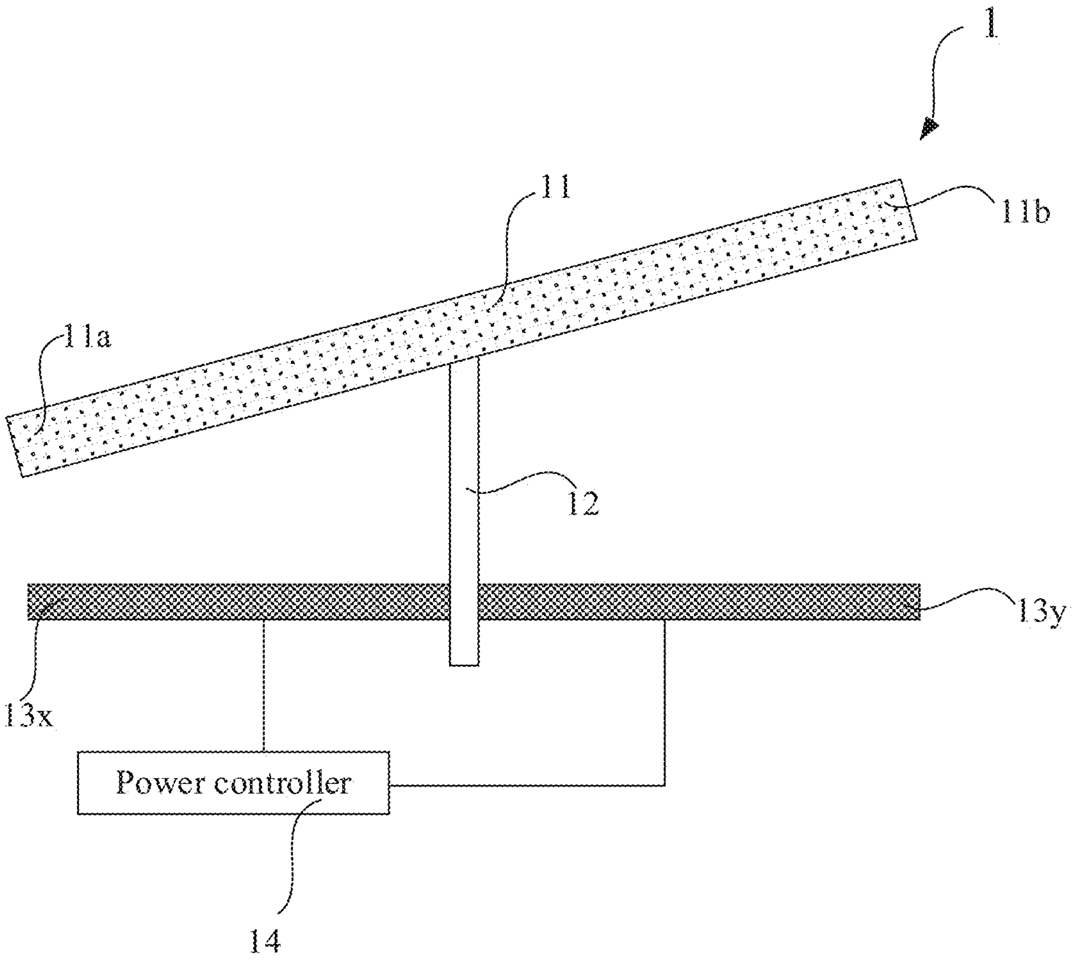
FIG. 5 is a schematic cross-sectional structure diagram of a vertical section of the bearing system in FIG. 4.

Correspondingly, the first embodiment of the present disclosure further provides a bearing system. FIG. 4 is a schematic perspective structure diagram of a bearing system. FIG. 5 is a schematic cross-sectional structural diagram of a vertical section of the bearing system in FIG. 4.

Referring to FIGS. 4 and 5, the bearing system 1 includes:

a susceptor 11;

a rotating shaft 12 fixed under the susceptor 11, where the rotating shaft 12 and the susceptor 11 rotate synchronously;

a heating wire 13 located under the susceptor 11, where the heating wire 13 includes n heating wire units 131, 132, . . . , 13*n* arranged in a circumferential direction of the susceptor 11, n≥2, and temperature of each of the heating wire units 131, 132 . . . , 13*n* is independently controlled; and a power controller 14 configured to, during rotation of the susceptor 11, control a power of a heating wire unit 13*x* directly under a down end 11*a* of the susceptor 11 to be less than a power of each of other heating wire units 131, 132, . . . , 13*x*−1, 13*x*+1, . . . , 13*n*, and/or control a power of a heating wire unit 13*y* directly under an up end 11*b* of the susceptor 11 to be greater than a power of each of other heating wire units 131, 132, . . . , 13*y*−1, 13*y*+1, . . . , 13*n*.

In the bearing system 1, during rotation of the susceptor 11, by using the power controller 14 to control the power of the heating wire unit 13*x* directly under the down end 11*a* of the susceptor 11 to be less than the powers of the other heating wire units 131, 132, . . . , 13*x*-1, 13*x*+1, . . . , 13*n*, and/or control the power of the heating wire unit 13*y* directly under the up end 11*b* of the susceptor 11 to be greater than the powers of the other heating wire units 131, 132, . . . , 13*y*−1, 13*y*+1, . . . , 13*n*, the temperature of each region of the susceptor 11 can be consistent, and a growth temperature of each region of a substrate on the susceptor 11 is uniform, thereby realizing an epitaxially grown film layer with uniform properties.

Figure 6:
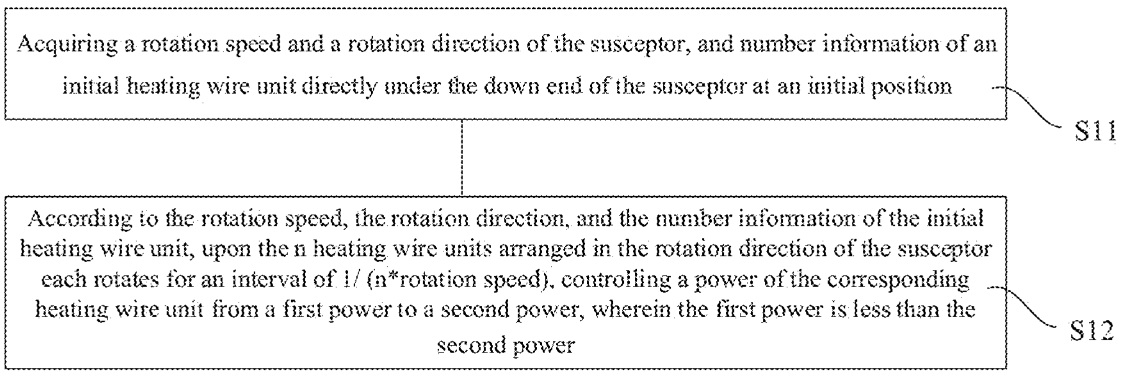
FIG. 6 is a flowchart of a power control method for a bearing device according to a second embodiment of the present disclosure.

FIG. 6 is a flowchart of a power control method for a bearing device according to a second embodiment of the present disclosure.

The bearing device of the second embodiment is the same as the bearing device of the first embodiment, and the difference lies in the power control method. Specifically, in the power control method of the first embodiment, during rotation of the susceptor 11, configuring the power of the heating wire unit 13*x* directly under the down end 11*a* of the susceptor 11 to be less than the power of each of the other heating wire units 131, 132, . . . , 13*x*−1, 13*x*+1, . . . , 13*n* may include:

Step S11, acquiring a rotation speed and a rotation direction of the susceptor 11, and number information of an initial heating wire unit 13*p* directly under the down end 11*a* of the susceptor 11 at an initial position;

Step S12, according to the rotation speed, the rotation direction, and the number information of the initial heating wire unit 13*p*, upon the n heating wire units 13*p*,

13*p*+1, . . . , 13*p*−1 arranged in the rotation direction of the susceptor 11 each rotates for an interval of 1/(n*rotation speed), configuring a power of the corresponding heating wire unit from a first power P1 to a second power P2, where the first power P1 is less than the second power P2. For example, upon the heating wire unit 13*p* rotates for the interval of 1/(n*rotation speed), a power of the heating wire unit 13*p* is configured from the first power P1 to the second power P2; upon the heating wire unit 13*p*+1 next to the heating wire unit 13*p* in the rotation direction of the susceptor 11 rotates for the interval of 1/(n*rotation speed), a power of the heating wire unit 13*p*+1 is configured from the first power P1 to the second power P2; upon the heating wire unit 13*p*+2 next to the heating wire unit 13*p*+1 in the rotation direction of the susceptor 11 rotates for the interval of 1/(n*rotation speed), a power of the heating wire unit 13*p*+2 is configured from the first power P1 to the second power P2; . . . ; and upon the heating wire unit 13*p*−1 adjacent to the heating wire unit 13*p* rotates for the interval of 1/(n*rotation speed), a power of the heating wire unit 13*p*−1 is configured from the first power P1 to the second power P2.

In step S11, the rotation speed and the rotation direction of the susceptor 11 can be acquired through a storage list, that is, before the deposition process, the rotation speed and the rotation direction of the susceptor 11 are stored in the storage list.

In the second embodiment, the number information of the first heating wire unit 131 may be, for example, 131; the number information of the second heating wire unit 132 may be 132; . . . ; the number information of the n-th heating wire unit 13*n* may be, for example, 13*n*. In other words, the number information of the respective heating wire units 131, 132 . . . , 13*n* is unchanged.

In other embodiments, in step S11, acquiring the number information of the initial heating wire unit 13*p* directly under the down end 11*a* of the susceptor 11 at the initial position may include: configuring the number information of an initial heating wire unit 13*p* directly under the down end 11*a* of the susceptor 11 at an initial position as 131, and configuring number information of then heating wire units 13*p*, 13*p*+1, . . . , 13*p*−1 arranged in the rotation direction of the susceptor 11 as 131, 132, . . . , 13*n*. In other words, the number information of each heating wire unit 131, 132, . . . , 13*n* is unchanged in one acquisition process, and in a next acquisition process, the number information of each heating wire unit 131, 132 . . . , 13*n* is re-determined.

In step S12, each heating wire unit 13*p*, 13*p*+1, . . . , 13*p*−1 rotates at the first power P1 for a 1/(n*rotation speed) time period, and rotates at the second power P2 for other time periods.

It can be seen that when a deposition process is performed according to the power control method of the second embodiment, the n heating wire units 13*p*, 13*p*+1, . . . , 13*p*−1 are preconfigured to perform power jumps according to a predetermined rule.

Further, in some embodiments, in step S11, a first distance L1 between the down end 11*a* and the initial heating wire unit 13*p* and a second distance L2 between a fixing point of the susceptor 11 and the rotating shaft 12 and the heating wire 13 directly under the fixing point are further acquired; and in step S12, a ratio between the first power P1 and the second power P2 is proportional to a ratio between the first distance L1 and the second distance L2.

Figure 7:
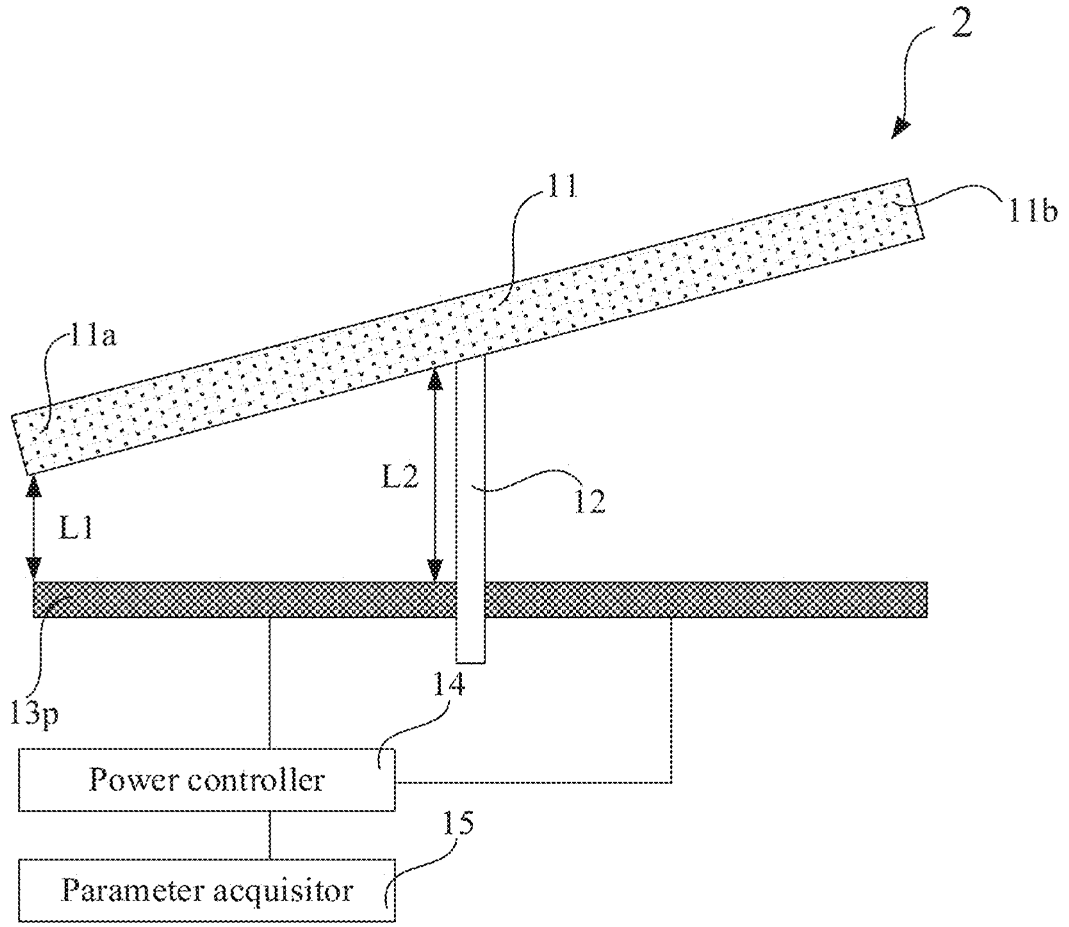
FIG. 7 is a schematic cross-sectional structure diagram of a bearing system according to the second embodiment of the present disclosure.

Correspondingly, the second embodiment of the present disclosure further provides a bearing system. FIG. 7 is a schematic cross-sectional structure diagram of the bearing system.

Specifically, as shown in FIG. 7, the bearing system 2 further includes:

- a parameter acquisitor 15 configured to acquire a rotation speed and a rotation direction of the susceptor 11, and number information of an initial heating wire unit 13*p* directly under the down end 11*a* of the susceptor 11 at an initial position; and
- the power controller 14 is further configured to, according to the rotation speed, the rotation direction, and the number information of the initial heating wire unit 13*p* acquired by the parameter acquisitor 15, upon the n heating wire units 13*p*, 13*p*+1, . . . , 13*p*−1 arranged in the rotation direction of the susceptor 11 each rotates for an interval of 1/(n*rotation speed), configure a power of the corresponding heating wire unit from a first power P1 to a second power P2, where the first power P1 is less than the second power P2.

In some embodiments, the parameter acquisitor 15 is further configured to acquire a first distance L1 between the down end 11*a* and the initial heating wire unit 13*p*, and a second distance L2 between a fixing point of the susceptor 11 and the rotating shaft 12 and the heating wire 13 directly under the fixing point, where a ratio between the first power P1 and the second power P2 is proportional to a ratio between the first distance L1 and the second distance L2.

Figure 8:
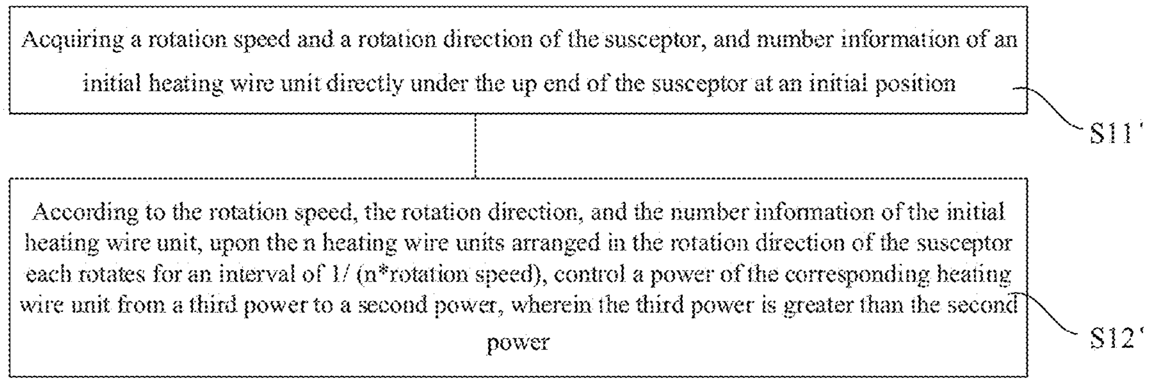
FIG. 8 is a flowchart of a power control method for a bearing device according to a third embodiment of the present disclosure.

FIG. 8 is a flowchart of a power control method for a bearing device according to a third embodiment of the present disclosure.

The bearing device of the third embodiment is the same as the bearing device of the first embodiment, and the difference lies in the power control method. Specifically, in the power control method of the first embodiment, during rotation of the susceptor 11, configuring a power of a heating wire unit 13*y* directly under an up end 11*b* of the susceptor 11 to be greater than a power of each of other heating wire units 131, 132, . . . , 13*y*−1, 13*y*+1, . . . , 13*n* includes:

Step S11', acquiring a rotation speed and a rotation direction of the susceptor 11, and number information of an initial heating wire unit 13*q* directly under the up end 11*b* of the susceptor 11 at an initial position;

Step S12', according to the rotation speed, the rotation direction, and the number information of the initial heating wire unit 13*q*, upon the n heating wire units 13*q*, 13*q*+1, . . . , 13*q*−1 arranged in the rotation direction of the susceptor 11 each rotates for an interval of 1/(n*rotation speed), configuring a power of the corresponding heating wire unit from a third power P3 to a second power P2, where the third power P3 is greater than the second power P2. For example, upon the heating wire unit 13*q* rotates for the interval of 1/(n*rotation speed), a power of the heating wire unit 13*q* is configured from the third power P3 to the second power P2; upon the heating wire unit 13*q*+1 next to the heating wire unit 13*q* in the rotation direction of the susceptor 11 rotates for the interval of 1/(n*rotation speed), a power of the heating wire unit 13*q*+1 is configured from the third power P3 to the second power P2; upon the heating wire unit 13*q*+2 next to the heating wire unit 13*q*+1 in the rotation direction of the susceptor 11 rotates for the interval of 1/(n*rotation speed), a power of the heating wire unit 13*q*+2 is configured from the third power P3 to the second power P2; . . . ; and upon the heating wire unit 13*q*−1 adjacent to the heating wire unit 13*q* rotates for the interval of 1/(n*rotation speed), a power of the heating wire unit 13*q*−1 is configured from the third power P3 to the second power P2.

In step S11', the rotation speed and the rotation direction of the susceptor 11 can be acquired through a storage list, that is, before the deposition process, the rotation speed and the rotation direction of the susceptor 11 are stored in the storage list.

In the third embodiment, the number information of the first heating wire unit 131 may be, for example, 131; the number information of the second heating wire unit 132 may be 132; . . . ; the number information of the nth heating wire unit 13*n* may be, for example, 13*n*. In other words, the number information of the respective heating wire units 131, 132 . . . , 13*n* is unchanged.

In other embodiments, in step S11', acquiring the number information of the initial heating wire unit 13*q* directly under the up end 11*b* of the susceptor 11 at the initial position may include: configuring the number information of an initial heating wire unit 13*q* directly under the up end 11*b* of the susceptor 11 at an initial position as 131, and configuring number information of then heating wire units 13*q*, 13*q*+1, . . . , 13*q*−1 arranged in the rotation direction of the susceptor 11 as 131, 132, . . . , 13*n*. In other words, the number information of each heating wire unit 131, 132, . . . , 13*n* is unchanged in one acquisition process, and in a next acquisition process, the number information of each heating wire unit 131, 132 . . . , 13*n* is re-determined.

In step S12', each of the heating wire units 13*q*, 13*q*+1, 13*q*−1 rotates at the third power P3 for a 1/(n*rotation speed) time period, and rotates at the second power P2 for other time periods.

It can be seen that when a deposition process is performed according to the power control method of the third embodiment, the n heating wire units 13*q*, 13*q*+1, 13*q*−1 are preconfigured to perform power jumps according to a predetermined rule.

Further, in some embodiments, in step S11', a third distance L3 between the up end 11*b* and the initial heating wire unit 13*q* and a second distance L2 between a fixing point of the susceptor 11 and the rotating shaft 12 and the heating wire 13 directly under the fixing point are further acquired; in step S12', a ratio between the third power P3 and the second power P2 is proportional to a ratio between the third distance L3 and the second distance L2.

Figure 9:
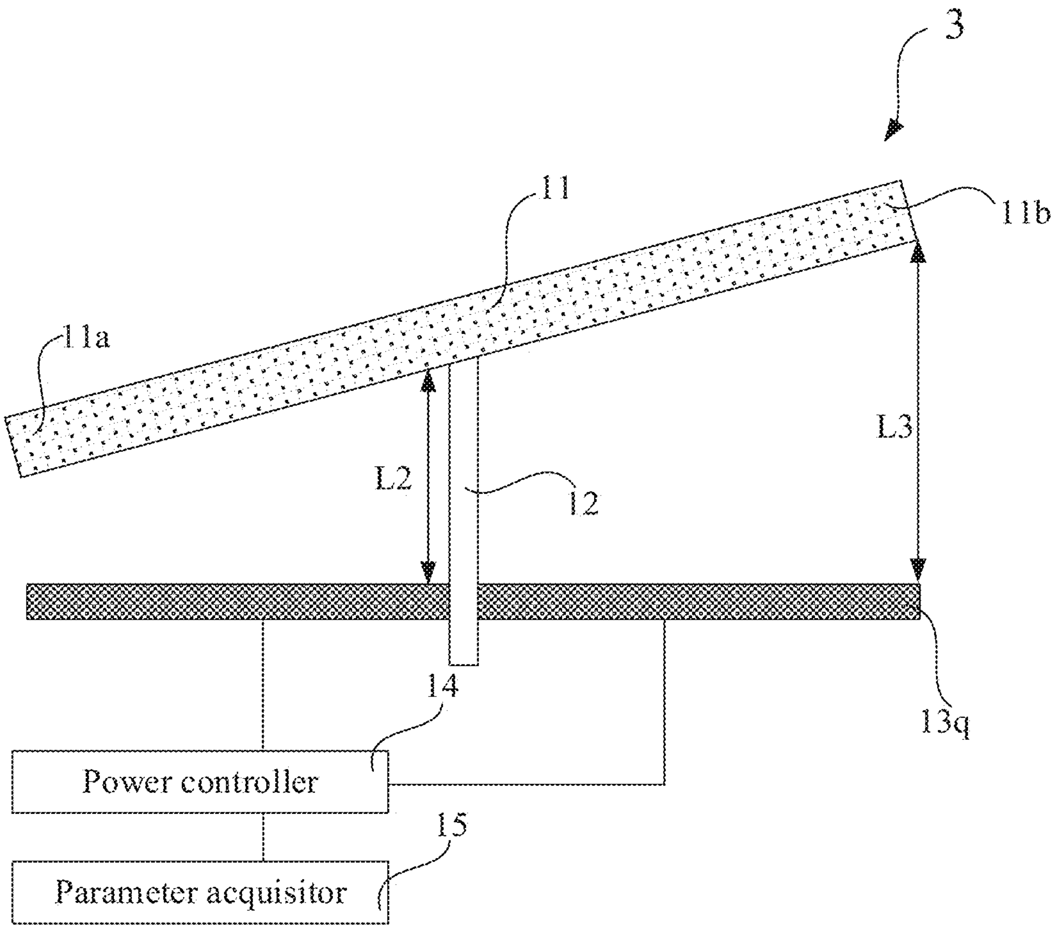
FIG. 9 is a schematic cross-sectional structure diagram of a bearing system according to the third embodiment of the present disclosure.

Correspondingly, the third embodiment of the present disclosure further provides a bearing system. FIG. 9 is a schematic cross-sectional structure diagram of the bearing system.

Specifically, as shown in FIG. 9, the bearing system 3 further includes:

a parameter acquisitor 15 configured to acquire a rotation speed and a rotation direction of the susceptor 11, and number information of an initial heating wire unit 13*q* directly under the up end 11*b* of the susceptor 11 at an initial position; and the power controller 14 is further configured to, according to the rotation speed, the rotation direction, and the number information of the initial heating wire unit 13*q* acquired by the parameter acquisitor 15, upon the n heating wire units 13*q*, 13*q*+1, . . . , 13*q*−1 arranged in the rotation direction of the susceptor 11 each rotates for an interval of 1/(n*rotation speed), control a power of the corresponding heating wire unit from a third power P3 to a second power P2, where the third power P3 is greater than the second power P2.

In some embodiments, the parameter acquisitor 15 is further configured to acquire a third distance L3 between the up end 11*b* and the initial heating wire unit 13*q*, and a second distance L2 between a fixing point of the susceptor 11 and the rotating shaft 12 and the heating wire 13 directly under the fixing point, where a ratio between the third power P3 and the second power P2 of the power controller 14 is proportional to a ratio between the third distance L3 and the second distance L2.

The solutions of the third embodiment and the second embodiment can also be combined to form a new solution. For example, in some embodiments, the power control method of the first embodiment specifically includes:

Step S31, acquiring a rotation speed and a rotation direction of the susceptor 11, and number information of an initial heating wire unit 13*p* directly under the down end 11*a* of the susceptor 11 at an initial position and number information of an initial heating wire unit 13*q* directly under the up end 11*b* of the susceptor 11 at an initial position;

Step S32, according to the rotation speed, the rotation direction, and the number information of the initial heating wire units 13*p* and 13*q*, upon the n heating wire units 13*p*, 13*p*+1, . . . , 13*p*−1 arranged in the rotation direction of the susceptor 11 each rotates for an interval of 1/(n*rotation speed), configuring a power of the corresponding heating wire unit from a first power P1 to a second power P2, where the first power P1 is less than the second power P2, and upon the n heating wire units 13*q*, 13*q*+1, . . . , 13*q*−1 arranged in the rotation direction of the susceptor 11 each rotates for an interval of 1/(n*rotation speed), configuring a power of the corresponding heating wire unit from a third power P3 to a second power P2, where the third power P3 is greater than the second power P2.

In some embodiments, the bearing system further includes:

a parameter acquisitor 15 configured to acquire a rotation speed and a rotation direction of the susceptor 11, and number information of an initial heating wire unit 13*p* directly under the down end 11*a* of the susceptor 11 at an initial position and number information of an initial heating wire unit 13*q* directly under the up end 11*b* of the susceptor 11 at an initial position; and a power controller 14 configured to according to the rotation speed, the rotation direction, and the number information of the initial heating wire units 13*p* and 13*q*, upon the n heating wire units 13*p*, 13*p*+1, . . . , 13*p*−1 arranged in the rotation direction of the susceptor 11 each rotates for an interval of 1/(n*rotation speed), configuring a power of the corresponding heating wire unit from a first power P1 to a second power P2, where the first power P1 is less than the second power P2, and upon then heating wire units 13*q*, 13*q*+1, . . . , 13*q*−1 arranged in the rotation direction of the susceptor 11 each rotates for an interval of 1/(n*rotation speed), configuring a power of the corresponding heating wire unit from a third power P3 to a second power P2, where the third power P3 is greater than the second power P2.

Figure 10:
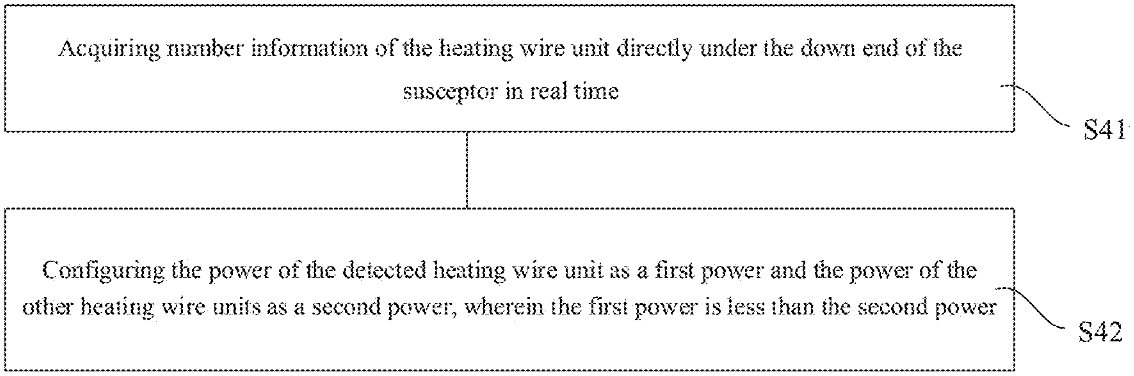
FIG. 10 is a flowchart of a power control method for a bearing device according to a fourth embodiment of the present disclosure.

FIG. 10 is a flowchart of a power control method for a bearing device according to a fourth embodiment of the present disclosure.

The bearing device of the fourth embodiment is the same as the bearing device of the first embodiment, and the difference lies in the power control method. Specifically, the power control method of the fourth embodiment: during the rotation, configuring the power of the heating wire unit 13*x* directly under the down end 11*a* of the susceptor 11 to be less than the power of each of the other heating wire units 131, 132, . . . , 13*x*−1, 13*x*+1, . . . , 13*n* may include:

Step S41, acquiring number information of the heating wire unit 13*x* directly under the down end 11*a* of the susceptor 11 in real time;

Step S42, configuring the power of the detected heating wire unit 13x as a first power P1 and the power of the other heating wire units 131, 132, . . . , 13x−1, 13x+1, . . . , 13n as a second power P2, where the first power P1 is less than the second power P2.

In the fourth embodiment, the number information of the first heating wire unit 131 may be, for example, 131; the number information of the second heating wire unit 132 may be 132; . . . ; the number information of the nth heating wire unit 13n may be, for example, 13n. In other words, the number information of the respective heating wire units 131, 132 . . . , 13n is unchanged.

In step S42, each of the heating wire units 131, 132, . . . , 13n is at the first power P1 for 1/(n*rotation speed) time period, and is at the second power P2 for other time periods.

It can be seen that when a deposition process is performed according to the power control method of the fourth embodiment, powers of the n heating wire units 13x, 13x+1, 13x−1 jump in real time according to a real-time position of the down end 11a.

Further, in some embodiments, in step S41, a fourth distance L4 between the down end 11a and the heating wire unit 13x directly under the down end 11a and a second distance L2 between a fixing point of the susceptor 11 and the rotating shaft 12 and the heating wire 13 directly under the fixing point are further acquired in real time; in step S42, the ratio between the first power P1 and the second power P2 is proportional to the ratio between the fourth distance L4 and the second distance L2.

Figure 11:
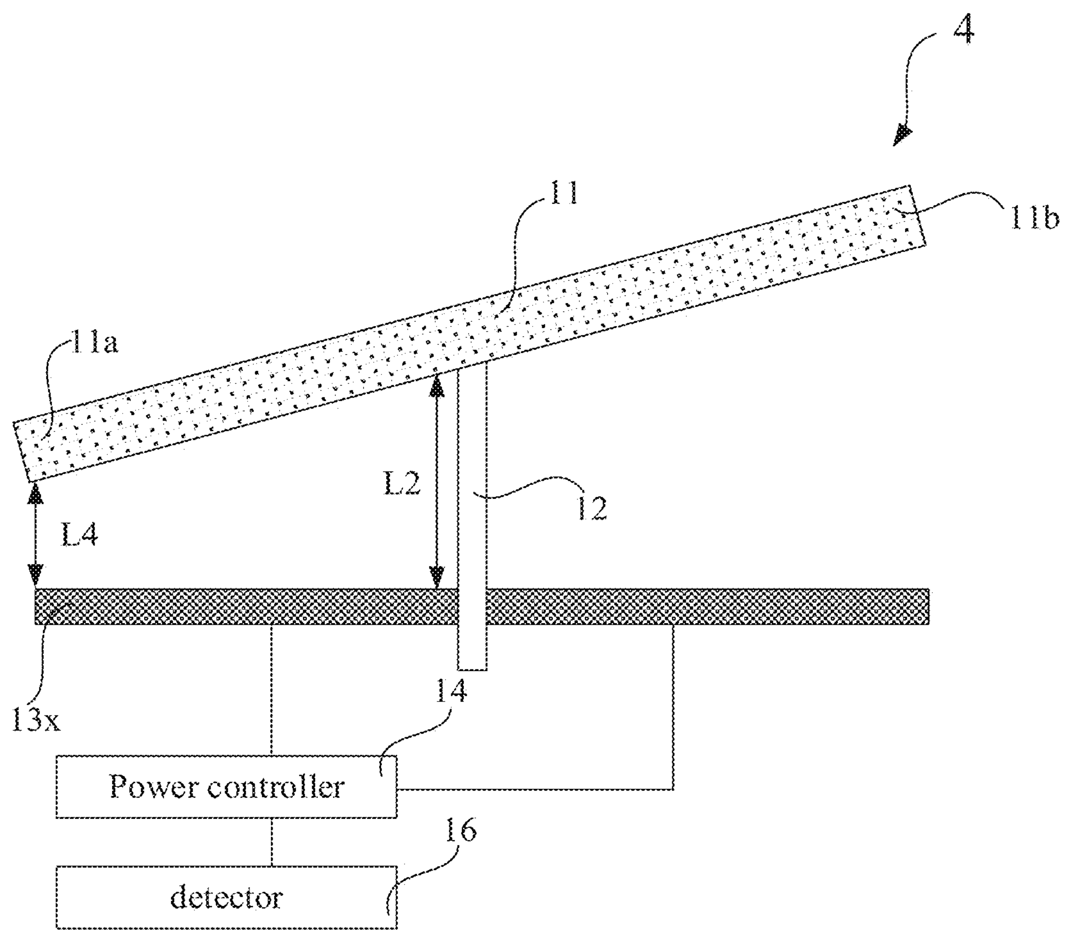
FIG. 11 is a schematic cross-sectional structure diagram of a bearing system according to the fourth embodiment of the present disclosure.

Correspondingly, the fourth embodiment of the present disclosure further provides a bearing system. FIG. 11 is a schematic cross-sectional structure diagram of the bearing system.

Specifically, as shown in FIG. 11, the bearing system 4 further includes:

a detector 16 configured to acquire number information of the heating wire unit 13x directly under the down end 11a of the susceptor 11 in real time; and the power controller 14 is further configured to configure the power of the heating wire unit 13x detected by the detector 16 as a first power P1 and the power of the other heating wire units 131, 132, . . . , 13x−1, 13x+1, . . . , 13n as a second power P2, where the first power P1 is less than the second power P2.

In some embodiments, the detector 16 is further configured to acquire a fourth distance L4 between the down end 11a and the heating wire unit 13x directly under the down end 11a and a second distance L2 between a fixing point of the susceptor 11 and the rotating shaft 12 and the heating wire 13 directly under the fixing point in real time; the ratio between the first power P1 and the second power P2 of the power controller 14 is proportional to the ratio between the fourth distance L4 and the second distance L2.

Figure 12:
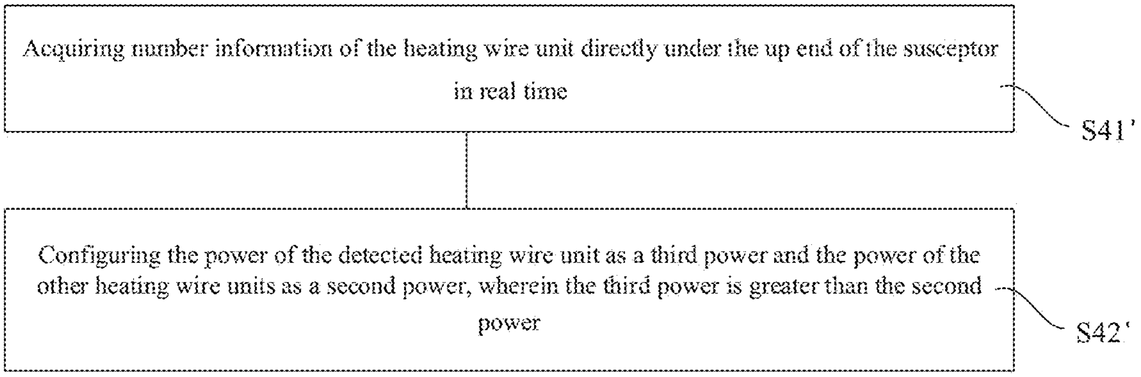
FIG. 12 is a flowchart of a power control method for a bearing device according to a fifth embodiment of the present disclosure.

FIG. 12 is a flowchart of a power control method for a bearing device according to a fifth embodiment of the present disclosure.

The bearing device of the fifth embodiment is the same as the bearing device of the first embodiment, and the difference lies in the power control method. Specifically, the power control method of the fifth embodiment: during the rotation, configuring the power of the heating wire unit 13y directly under the up end 11b of the susceptor 11 to be greater than the power of each of the other heating wire units 131, 132, . . . , 13y−1, 13y+1, . . . , 13n may include:

Step S41', acquiring number information of the heating wire unit 13y directly under the up end 11b of the susceptor 11 in real time;

Step S42', configuring the power of the detected heating wire unit 13y as a third power and the power of the other heating wire units 131, 132, . . . , 13y−1, 13y+1, . . . , 13n as a second power, where the third power is greater than the second power.

In the fifth embodiment, the number information of the first heating wire unit 131 may be, for example, 131; the number information of the second heating wire unit 132 may be 132; . . . ; the number information of the nth heating wire unit 13n may be, for example, 13n. In other words, the number information of the respective heating wire units 131, 132 . . . , 13n is unchanged.

step S42', each of the heating wire units 131, 132, . . . , 13n is at the third power P3 for 1/(n*rotation speed) time period, and is at the second power P2 in other time periods.

It can be seen that when a deposition process is performed according to the power control method of the fifth embodiment, powers of then heating wire units 13y, 13y+1, . . . , 13y-1 jump in real time according to a real-time position of the up end 11b.

Further, in some embodiments, in step S41', a fifth distance L5 between the up end 11b and the heating wire unit 13y directly under the up end 11b and a second distance L2 between a fixing point of the susceptor 11 and the rotating shaft 12 and the heating wire 13 directly under the fixing point are further acquired in real time; in step S42', the ratio between the third power P3 and the second power P2 is proportional to the ratio between the fifth distance L5 and the second distance L2.

Figure 13:
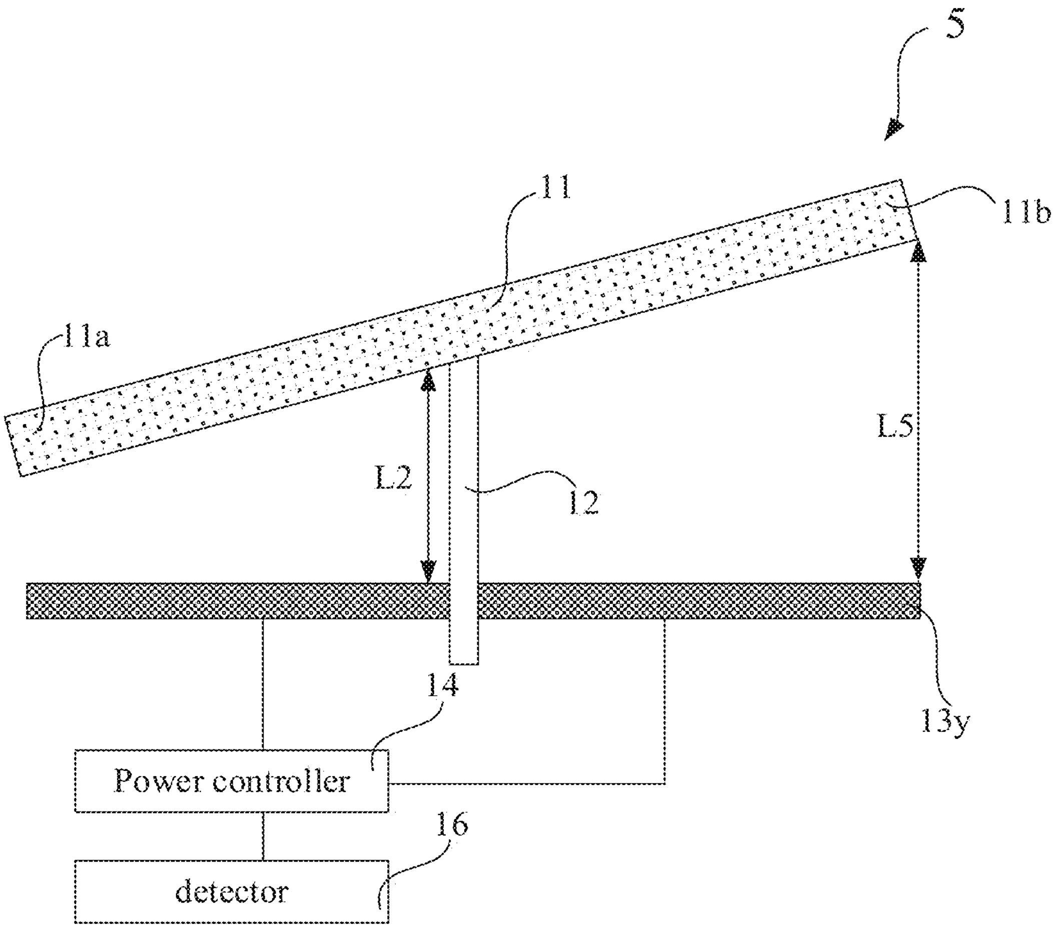
FIG. 13 is a schematic cross-sectional structure diagram of a bearing system according to the fifth embodiment of the present disclosure.

Correspondingly, the fifth embodiment of the present disclosure further provides a bearing system. FIG. 13 is a schematic cross-sectional structure diagram of the bearing system.

Specifically, as shown in FIG. 13, the bearing system 5 further includes:

a detector 16 configured to acquire number information of the heating wire unit 13y directly under the up end 11b of the susceptor 11 in real time; and the power controller 14 is further configured to configure the power of the heating wire unit 13y detected by the detector 16 as a third power P3 and the power of the other heating wire units 131, 132, . . . , 13y−1, 13y+1, . . . , 13n as a second power P2, where the third power P3 is greater than the second power P2.

In some embodiments, the detector 16 is further configured to acquire a fifth distance L5 between the up end 11b and the heating wire unit 13y directly under the up end 11b and a second distance L2 between a fixing point of the susceptor 11 and the rotating shaft 12 and the heating wire 13 directly under the fixing point in real time; the ratio between the third power P3 and the second power P2 of the power controller 14 is proportional to the ratio between the fifth distance L5 and the second distance L2.

Although the present disclosure is disclosed above, the present disclosure is not limited thereto. Any person skilled in the art can make various changes and modifications without departing from the spirit and scope of the present disclosure. Therefore, the protection scope of the present disclosure should be based on the scope defined by the claims.

The invention claimed is:

1. A bearing system, comprising:

a susceptor;

a rotating shaft fixed under the susceptor, wherein the rotating shaft and the susceptor rotate synchronously;

a heating wire located under the susceptor, wherein the heating wire comprises n heating wire units arranged in a circumferential direction of the susceptor, n≥2, and temperature of each of the heating wire units is independently controlled; and a power controller configured to: during rotation of the susceptor, control at least one of:

a power of a heating wire unit directly under a down end of the susceptor to be less than a power of each of other heating wire units, or a power of a heating wire unit directly under an up end of the susceptor to be greater than a power of each of other heating wire units.

2. The bearing system according to claim 1, wherein each of the heating wire units spreads out at a same angle in the circumferential direction of the susceptor.

3. The bearing system according to claim 2, further comprising:

a parameter acquisitor configured to acquire a rotation speed and a rotation direction of the susceptor, and number information of an initial heating wire unit directly under the down end of the susceptor at an initial position;

wherein the power controller is further configured to, according to the rotation speed, the rotation direction, and the number information of the initial heating wire unit acquired by the parameter acquisitor, upon the n heating wire units arranged in the rotation direction of the susceptor each rotates for an interval of 1/(n*rotation speed), control a power of the corresponding heating wire unit from a first power to a second power, wherein the first power is less than the second power.

4. The bearing system according to claim 3, wherein the parameter acquisitor is further configured to acquire a first distance between the down end and the initial heating wire unit, and a second distance between a fixing point of the susceptor and the rotating shaft and the heating wire directly under the fixing point, wherein a ratio between the first power and the second power is proportional to a ratio between the first distance and the second distance.

5. The bearing system according to claim 2, further comprising:

a parameter acquisitor configured to acquire a rotation speed and a rotation direction of the susceptor, and number information of an initial heating wire unit directly under the up end of the susceptor at an initial position;

wherein the power controller is further configured to, according to the rotation speed, the rotation direction, and the number information of the initial heating wire unit acquired by the parameter acquisitor, upon the n heating wire units arranged in the rotation direction of the susceptor each rotates for an interval of 1/(n*rotation speed), control a power of the corresponding heating wire unit from a third power to a second power, wherein the third power is greater than the second power.

6. The bearing system according to claim 5, wherein the parameter acquisitor is further configured to acquire a third distance between the up end and the initial heating wire unit, and a second distance between a fixing point of the susceptor and the rotating shaft and the heating wire directly under the fixing point, wherein a ratio between the third power and the second power is proportional to a ratio between the third distance and the second distance.

7. The bearing system according to claim 1, further comprising:

a detector configured to acquire number information of the heating wire unit directly under the down end of the susceptor in real time;

wherein the power controller is further configured to configure the power of the heating wire unit detected by the detector as a first power and the power of the other heating wire units as a second power, wherein the first power is less than the second power.

8. The bearing system according to claim 1, further comprising:

a detector configured to acquire number information of the heating wire unit directly under the up end of the susceptor in real time;

wherein the power controller is further configured to configure the power of the heating wire unit detected by the detector as a third power and the power of the other heating wire units as a second power, wherein the third power is greater than the second power.

9. A power control method for a bearing device, wherein the bearing device comprises:

a susceptor;

a rotating shaft fixed under the susceptor, wherein the rotating shaft and the susceptor rotate synchronously; and a heating wire located under the susceptor, wherein the heating wire comprises n heating wire units arranged in a circumferential direction of the susceptor, n≥2, and temperature of each of the heating wire units is independently controlled; and the power control method comprises: during rotation of the susceptor (11), at least one of:

configuring a power of a heating wire unit directly under a down end of the susceptor to be less than a power of each of other heating wire units, or configuring a power of a heating wire unit directly under an up end of the susceptor to be greater than a power of each of other heating wire units.

10. The method according to claim 9, wherein each of the heating wire units spreads out at a same angle in the circumferential direction of the susceptor; and during the rotation, configuring the power of the heating wire unit directly under the down end of the susceptor to be less than the power of each of the other heating wire units comprises:

acquiring a rotation speed and a rotation direction of the susceptor, and number information of an initial heating wire unit directly under the down end of the susceptor at an initial position; and according to the rotation speed, the rotation direction, and the number information of the initial heating wire unit, upon the n heating wire units arranged in the rotation direction of the susceptor each rotates for an interval of 1/(n*rotation speed), controlling a power of the corresponding heating wire unit from a first power to a second power, wherein the first power is less than the second power.

11. The method according to claim 9, wherein each of the heating wire units spreads out at a same angle in the circumferential direction of the susceptor; and during the rotation, configuring the power of the heating wire unit directly under the up end of the susceptor to be greater than the power of each of the other heating wire units comprises:

acquiring a rotation speed and a rotation direction of the susceptor, and number information of an initial heating wire unit directly under the up end of the susceptor at an initial position; and according to the rotation speed, the rotation direction, and the number information of the initial heating wire unit, upon the n heating wire units arranged in the rotation direction of the susceptor each rotates for an interval of 1/(n*rotation speed), control a power of the corresponding heating wire unit from a third power to a second power, wherein the third power is greater than the second power.

12. The method according to claim 9, wherein during the rotation, configuring the power of the heating wire unit directly under the down end of the susceptor to be less than the power of each of the other heating wire units comprises:

acquiring number information of the heating wire unit directly under the down end of the susceptor in real time; and configuring the power of the detected heating wire unit as a first power and the power of the other heating wire units as a second power, wherein the first power is less than the second power.

13. The method according to claim 9, wherein during the rotation, configuring the power of the heating wire unit directly under the up end of the susceptor to be greater than the power of each of the other heating wire units comprises:

acquiring number information of the heating wire unit directly under the up end of the susceptor in real time; and configuring the power of the detected heating wire unit as a third power and the power of the other heating wire units as a second power, wherein the third power is greater than the second power.

* * * * *